United States Patent [19]
Ominato et al.

[11] Patent Number: 5,833,770
[45] Date of Patent: Nov. 10, 1998

[54] HIGH FREQUENCY SOFT MAGNETIC ALLOY AND PLANE MAGNETIC ELEMENT, ANTENNA AND WAVE ABSORBER COMPRISING THE SAME

[75] Inventors: Kumiko Ominato; Naoya Hasegawa; Yasuo Hayakawa; Akihiro Makino, all of Niigata-ken, Japan

[73] Assignee: Alps Electric Co., Ltd., Tokyo, Japan

[21] Appl. No.: 802,040

[22] Filed: Feb. 18, 1997

[30] Foreign Application Priority Data

Feb. 26, 1996 [JP] Japan .................................. 8-037963

[51] Int. Cl.$^6$ ............................ H01F 1/147; H01F 1/153
[52] U.S. Cl. ............................................ 148/305; 148/403
[58] Field of Search .................................. 148/304, 305, 148/403

[56] References Cited

U.S. PATENT DOCUMENTS

| | | | |
|---|---|---|---|
| 5,117,321 | 5/1992 | Nakanishi et al. ....................... | 360/120 |
| 5,573,863 | 11/1996 | Hakayakawa et al. ............. | 428/684 T |
| 5,591,276 | 1/1997 | Yoshizawa et al. ..................... | 148/305 |
| 5,656,101 | 8/1997 | Hayakawa et al. ..................... | 148/306 |

*Primary Examiner*—John Sheehan
*Attorney, Agent, or Firm*—Brinks Hofer Gilson & Lione

[57] ABSTRACT

A soft magnetic alloy used as a radio frequency magnetic material and having high resistivity and high magnetic permeability in a high frequency band, and an inductor, a wave absorber and antenna each comprising the soft magnetic alloy. The soft magnetic alloy has a crystal phase containing Co as a main component and at least one element T selected as a primary component from Fe, Ni, Pd, Mn and Al, and having a face-centered cubic structure, a body-centered cubic structure or a mixture thereof having an average crystal grain size of 30 nm or less; and a ferromagnetic amorphous phase surrounding the crystal phase and containing at least one element M selected from Ti, Zr, Hf, Nb, Ta, Mo, W, Y and rare earth elements, O, N, C, B, at least one oxide of element M, Fe and element T.

13 Claims, 9 Drawing Sheets

HIGH FREQUENCY SOFT MAGNETIC ALLOY AND PLANE MAGNETIC ELEMENT, ANTENNA AND WAVE ABSORBER COMPRISING THE SAME

BACKGROUND OF THE INVENTION

1. Field of the Invention

The present invention relates to a high frequency (more than 100 MHz) soft magnetic alloy exhibiting high magnetic permeability in a high frequency band and a low loss, and an inductor, an antenna and a wave absorber comprising the soft magnetic alloy.

2. Description of the Related Art

Miniaturization and improvement in performance of a magnetic element cause demand for a magnetic element having a high saturation magnetic flux density, high magnetic permeability in a frequency band of several hundreds MHz, and high resistivity.

Fe or alloys containing Fe as a main component are generally known as magnetic materials having a high saturation magnetic flux density. However, magnetic films of such Fe-based alloys which are formed by a film deposition technique such as a sputtering process have a high saturation magnetic flux density, but high coercive force or low resistivity and are thus difficult to obtain good soft magnetic characteristics.

On the other hand, one of the causes for a decrease in magnetic permeability at a high frequency is a loss due to the occurrence of an eddy current. In order to prevent the eddy current loss which is a cause for a decrease in high frequency magnetic permeability, it is desired to attempt to decrease the thickness of a film and increase the resistance of a thin film.

However, it is very difficult to increase resistivity while maintaining magnetic characteristics. The resistivity of a soft magnetic thin film of an alloy such as sendust or the like is as low as several tens to a hundred and tens $\mu\Omega$cm, and thus a soft magnetic alloy having increased resistivity while maintaining a saturation magnetic flux density of at least 0.5 T is demanded.

When an alloy thin film is obtained, the influences of magnetostriction, etc. make it more difficult to obtain good soft magnetic characteristics.

In the above-mentioned background, the inventors developed Fe-M-O type soft magnetic materials wherein element M indicates at least one or a mixture of a 4a group, 5a group, or rare earth elements, $50 \leq Fe \leq 70$, $5 \leq M \leq 30$ and $10 \leq O \leq 30$, and filed an application for patent in U.S. Pat. No. 5,573,863. This type of soft magnetic material has a high resistivity of 215.3 to 133709 $\mu\Omega$cm, and thus exhibits a low eddy current loss within a high frequency region, and permits the achievement of high permeability within a high frequency region and a high saturation magnetic flux density of 0.5 T (tesla) or more, as well as having a low coercive force of 0.8 to 4.0 Oe.

However, magnetic permeability is generally shown by the two values, i.e., the real number ($\mu'$) of permeability and the imaginary number ($\mu''$) of permeability, and it is desired for application to an inductor and an antenna that the real number is high, and the imaginary number is low. However, in a Fe—M—O type soft magnetic alloy thin film, although the real number ($\mu'$) of permeability in a radio frequency band of several hundreds MHz or more can be increased, the imaginary number of permeability is also increased to a value over the real number of permeability, and the value of (real number of permeability)/(imaginary number of permeability), i.e., Q value represented by ($\mu'$)/($\mu''$), becomes below 1, thereby causing the problem of increasing a loss.

Magneto plumbite represented by a composition formula such as $Ba_3Co_2Fe_{54}O_{41}$ (generally indicated by $Co_2Z$ or the like) is known as this type of bulk material exhibiting a high Q value within a high frequency region. However, this material has a Q value of 1 within a radio frequency region of 1 GHz, and the problem of increasing a loss in a higher frequency band of over 1 GHz, as shown in FIG. 11.

On the other hand, the field of communication (Personal Handyphone: PHS) or the like has a background in which the GHz band is further employed, and an air-core inductor is currently used as a part in this field. This field also has a background in which a higher Q value is further required. These backgrounds are true of antenna materials.

Although a wave absorber is required to have a high imaginary number ($\mu''$) of permeability in the frequency band of electromagnetic waves desired to be absorbed, the conventional materials shown in FIG. 11 have the tendency that the imaginary number of permeability rapidly decreases in a band of 1 GHz or more. Such conventional materials have the problem that they are unsuitable for a wave absorber in the GHz band.

SUMMARY OF THE INVENTION

The present invention has been achieved for solving the above problems, and an object of the present invention is to provide a soft magnetic alloy used as a magnetic material for high frequencies, and having high resistivity and high permeability in a high frequency band, and a plane magnetic element, a wave absorber and an antenna comprising the soft magnetic alloy.

In accordance with the present invention, there is provided a high frequency soft magnetic alloy mainly comprising a crystalline phase containing Co as a main component and at least one element T as a primary element selected from Fe, Ni, Pd, Mn and Al and having a face-centered cubic structure, a body-centered cubic structure or a mixture thereof and an average crystal grain size of 30 nm or less; and a ferromagnetic amorphous phase surrounding the crystalline phase and containing at least one element M selected from Ti, Zr, Hf, Nb, Ta, Mo, W, Y and rare earth elements, O, N, C, B, at least one oxide of element M, Fe and element T.

In the present invention, the alloy has an average crystal gain size of 7 nm or less.

In the present invention, the high frequency soft magnetic alloy has the following composition:

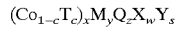

$$(Co_{1-c}T_c)_xM_yQ_zX_wY_s$$

wherein T is at least one element selected from Fe, Ni, Pd, Mn and Al; M is at least one element selected from Ti, Zr, Hf, Nb, Ta, Mo, W, Y and rare earth elements; Q is at least one element selected from O, N, C and B; X is one or two of Si and Cr; Y is at least one element selected from Au, Ag and platinum group elements; c indicating a composition ratio satisfies the relation $0.05 \leq c \leq 0.5$; y, z, w and s are shown by at % and satisfy the relations $3 \leq y \leq 30$, $7 \leq z \leq 40$, $0 \leq w \leq 20$ and $0 \leq s \leq 20$, respectively; x is the balance; the alloy also containing inevitable impurities.

In the present invention, composition ratios y and z in the composition more preferably satisfy the relations, $5 \leq y \leq 20$ and $10 \leq z \leq 30$, respectively, and element T is more preferably Fe.

In the present invention, the high frequency soft magnetic alloy has uniaxial anisotropy within a crystal face, the anisotropic magnetic field being 10 Oe or more.

In the present invention, the resistivity is 200 $\mu\Omega$·cm or 400 $\mu\Omega$·cm.

Preferably, the high frequency soft magnetic alloy is used as a magnetic core of an inductor, an antenna or a wave absorber.

DESCRIPTION OF THE PREFERRED EMBODIMENT

Figure 1:
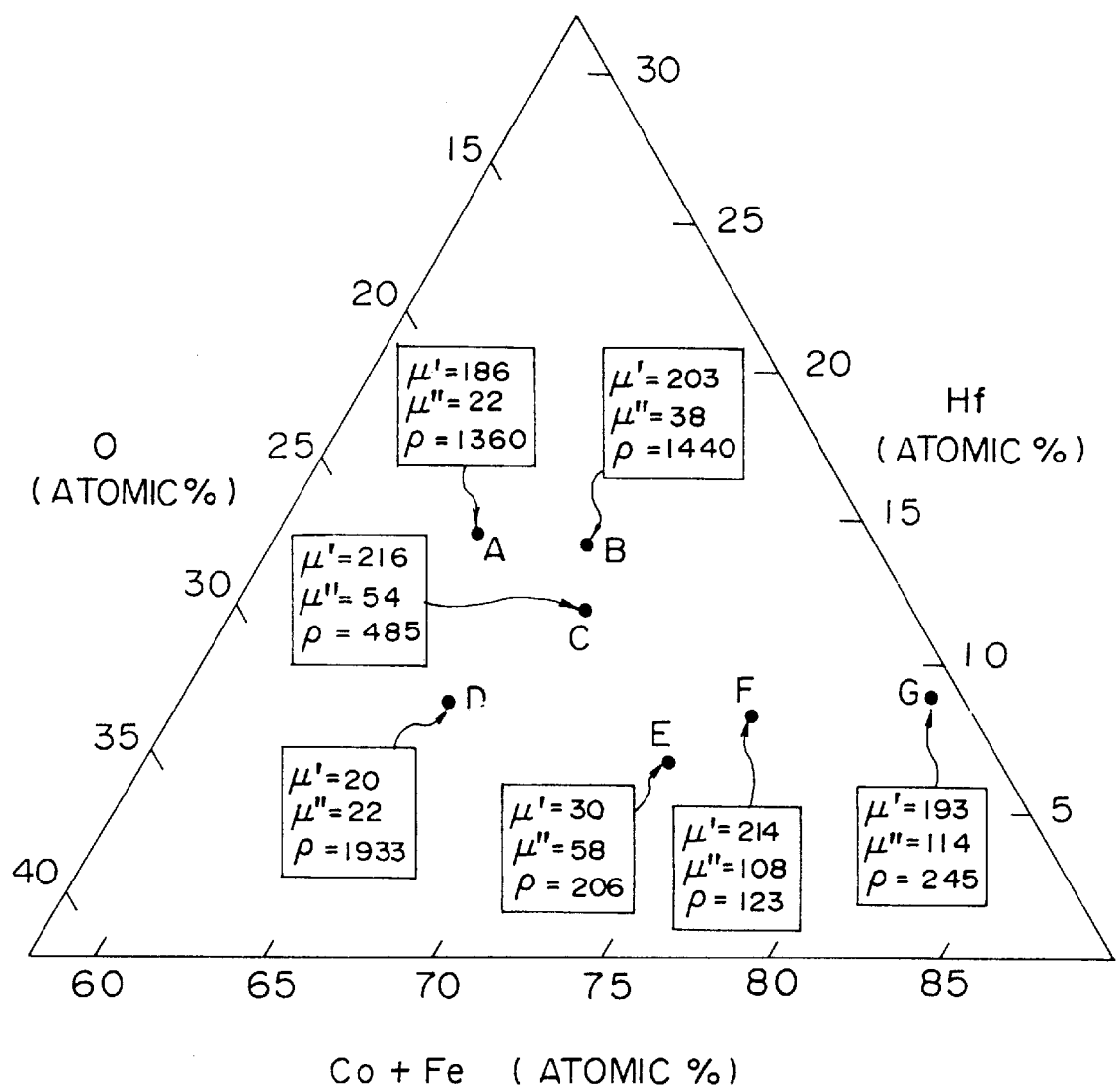
FIG. 1 is a triangular composition diagram showing the saturation magnetic flux density and/or resistivity at each composition ratio of an Co—Fe—Hf—O system alloy film in accordance with the present invention.

The present invention will be described in detail below.

In a high frequency soft magnetic alloy of the present invention, Co and element T are main components, and Co, Fe and Ni are elements which bear magnetism. Particularly, in order to obtain a high saturation magnetic flux density, the contents of Co and Fe are preferably as high as possible. However, if the contents of Co and Fe are excessively low, the saturation magnetic flux density becomes low.

Element M which is at least one element selected from Ti, Zr, Hf, Nb, Ta, Mo, W and rare earth elements. i.e., Sc, Y and lanthanoids such as La, Ce, Pr, Nd, Pm, Sm, Eu, Dy, Ho, Er, Tm, Yb and Lu, all of which belong to the 3A group in the periodic table, is necessary for obtaining soft magnetic characteristics. Such an element easily combines with oxygen to form an oxide. Resistivity can be increased by adjusting the content of the oxide of this element.

On the other hand, the composition ranges of the present invention permit the achievement of high resistivity, a decrease in eddy current loss due to an increase in resistivity, the prevention of a decrease in radio frequency permeability, and improvements in high frequency characteristics.

Particularly, Hf is considered as having the function to suppress magnetostriction.

Element T which is at least one element selected from Fe, Ni, Pd, Mn and Al has the function to stabilize the face-centered cubic structure (fcc structure) of Co or increase uniaxial anisotropy. Element Y which is at least one element selected from Au, Ag and platinum group elements such as Ru, Rh, Pd, Os, Ir and Pt improves the corrosion resistance of an alloy of the present invention. However, if the content of element Y exceeds 20 atomic % (at %), the soft magnetic characteristics (magnetic permeability) deteriorate.

In order to maintain a high saturation magnetic flux density while maintaining good soft magnetic characteristics, elements M, Q, X and Y are preferably within the following composition ranges, respectively, by at %:

$3 \leq M \leq 30, 7 \leq Q \leq 40, 0 \leq X \leq 20, 0 \leq Y \leq 20$

In order to securely obtain good soft magnetic characteristics and a high saturation magnetic flux density, elements M and Q are preferably within the following composition ranges, respectively, by at %:

$5 \leq M \leq 20, 10 \leq Q \leq 30$

A magnetic film comprising the above-described alloy is formed by a film forming technique such as sputtering, vapor deposition or the like. As a sputtering apparatus, existing apparatus such as a RF double-pole sputtering, DC sputtering, magnetron sputtering, triple-pole sputtering, ion beam sputtering or opposite target type sputtering apparatus or the like can be used.

An effective method of adding O (oxygen) to the soft magnetic alloy is a reactive sputtering method of sputtering in an atmosphere of ($Ar+O_2$) mixed gas containing an inert gas such as Ar and $O_2$ gas, or a method of sputtering a composite target comprising an oxide of element M ($HfO_2$ or the like) in an Ar atmosphere.

The alloy film can also be formed by using a composite target comprising a Co target and pellets of element M such as a rare earth element or element T, which are disposed on the Co target, in an inert gas such as Ar.

In the texture of the soft magnetic alloy film, a microcrystalline phase may have a bcc structure (body-centered cubic structure), and the texture may be a mixed texture comprising a microcrystalline phase of the fcc structure, a microcrystalline phase of the bcc structure and the remainder mainly comprising an amorphous phase containing Co and element T. The alloy film having such a texture and the above composition has uniaxial anisotropy within a crystal face and an anisotropic magnetic field of 10 Oe or more, and thus the resistivity can be increased to 200 $\mu\Omega$·cm or more, and further increased to 400 $\mu\Omega$·cm or more. The average crystal grain size is 30 nm or less, and, in order to obtain good magnetic characteristics, the average crystal grain size is more preferably 7 nm or less.

EXAMPLE (1) Film deposition

Sputtering was carried out by using a radio frequency double-pole sputtering apparatus and a composite target comprising a Co target and pellets of each of the elements such as element M, element T, etc. in an atmosphere of mixed gases containing Ar and 0.1 to 1.0% $O_2$. The sputtering time was adjusted to obtain a film thickness of about 2 $\mu$m. Main sputtering conditions were as follows:

Pre-exhaust: $1 \times 10^{-6}$ torr or less

High frequency input: 200 W

Ar gas pressure: 6 to $8 \times 10^{-3}$ torr

Substrate: crystallized glass substrate (indirect water cooling)

Electrode distance: 72 mm (2) Heat treatment

After film deposition, in order to improve the soft magnetic characteristics of the film, the film was annealed by maintaining it at a temperature within the range of 300° to 600° C. for 60 to 360 minutes without a magnetic filed or in a magnetic field, and then slowly cooling the film.

(3) Measurement

The composition of the resultant alloy magnetic film was determined by an inert gas melt infrared absorption method.
(Test 1)

The value ($\mu'$) of the real number and the value ($\mu''$) of the imaginary number of complex magnetic permeability of the alloy magnetic film at 500 MHz were measured. The resistivity ($\rho$) was measured by a four-terminal method.

The triangular composition diagram of FIG. 1 shows the results of measurement of magnetic permeability ($\mu'$, $\mu''$) and resistivity ($\rho$) against the (Co+Fe) content, the Hf content and the O content in the CoFeHfO type thin film samples (A, B, C, D, E, F, G) formed by the above method.

The results shown in FIG. 1 indicate that, as the Hf and O contents increase, the resistivity increases, the value Q (=$\mu'/\mu''$) increases, and a high frequency loss decreases. Therefore, samples A, B and C are suitable for application to an antenna, a transformer and a plane magnetic element (inductor). Since Samples E, F and G exhibit high values of $\mu''$ in the vicinity of 500 MHz, a loss in a high frequency band is high, and thus these samples are suitable for application to a wave absorber. However, the above divisions of application according to the compositions are not absolute, and, of course, the divisions are changed with changes in the frequency band and thickness used.

Figure 2:
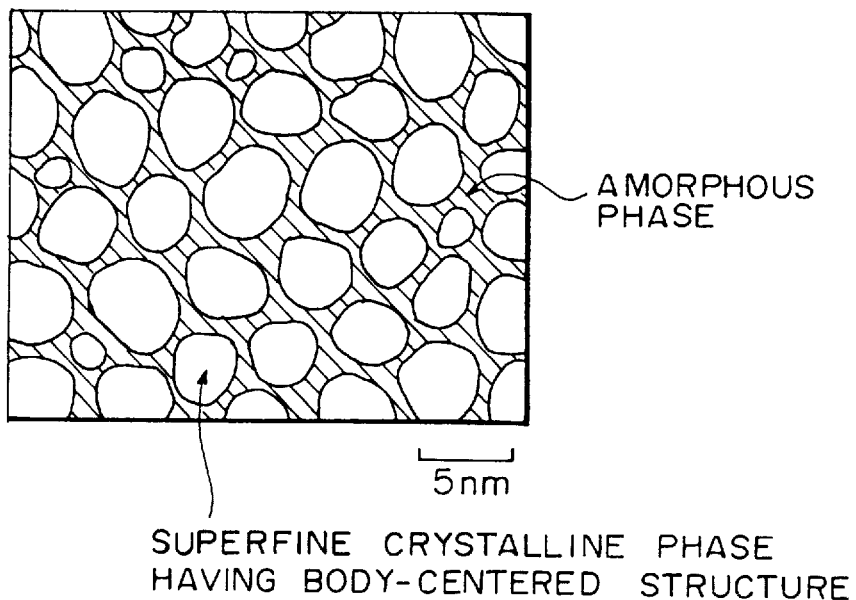
FIG. 2 is a schematic drawing of a high-resolution transmission type electron microscope photograph of a soft magnetic alloy represented by $Co_{46.5}Fe_{17.5}Hf_{14.4}O_{21.6}$.

FIG. 2 is a schematic drawing showing a high-resolution transmission type electron microscope photograph of an alloy film having the composition, $Co_{46.5}Fe_{17.5}Hf_{14.4}O_{21.6}$. As a result of electron beam diffraction and X-ray diffraction of this sample, it was found that this film comprises ultrafine crystal grains having a grain size of about 3 to 5 nm and the body-centered cubic structure, and an amorphous phase (the shadowed region shown in FIG. 2) present in the grain boundaries so as to surround the crystal grains. The results of X-ray diffraction are shown in FIG. 3.

Figure 3:
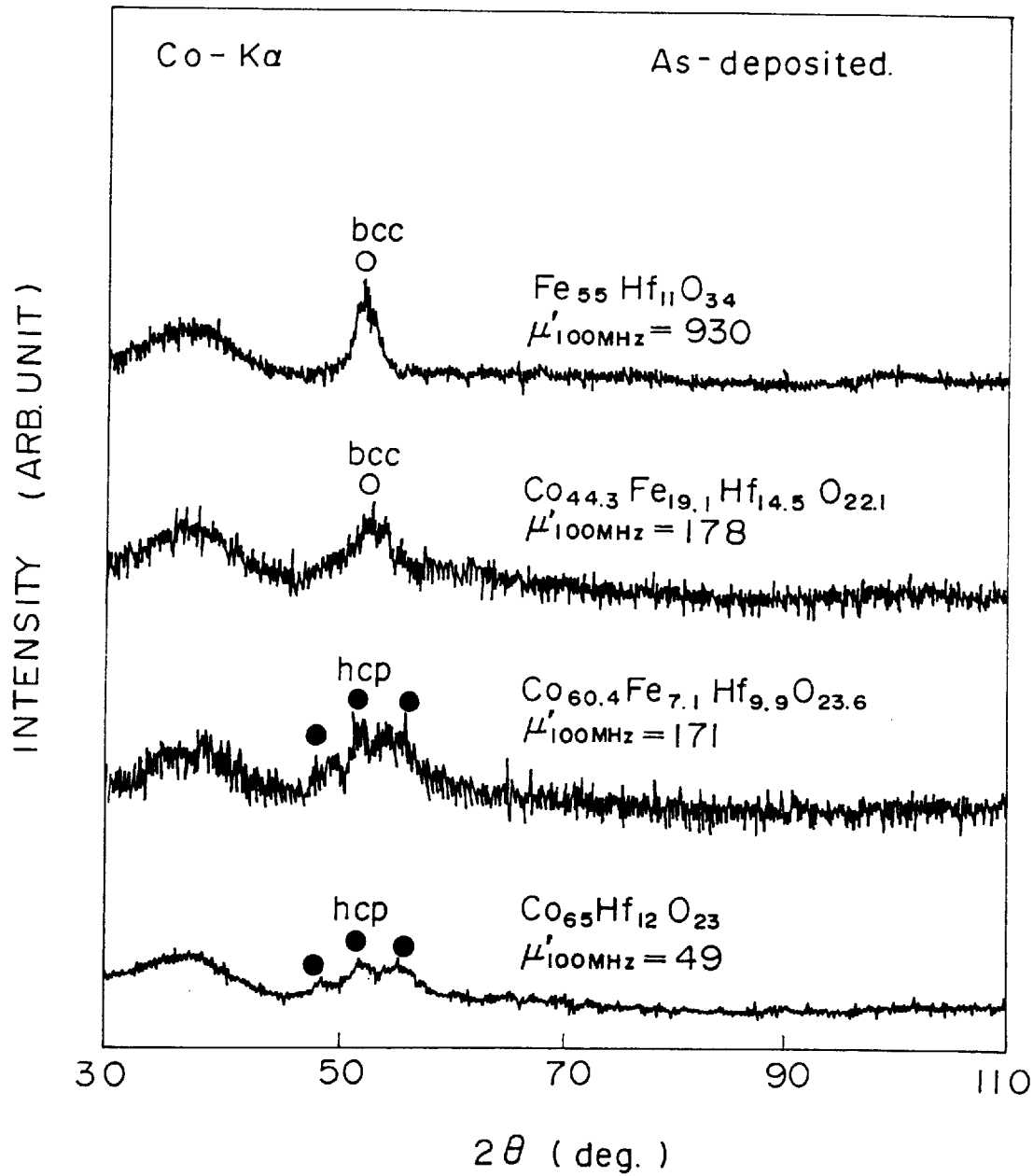
FIG. 3 is a graph showing the results of X-ray diffraction of films of examples of the present invention and comparative examples.

FIG. 3 shows the X-ray diffraction patterns of Co—Hf—O films having various Co and Fe composition ratios in the as-deposited state (as deposited). FIG. 3 also shows the $\mu'$ values at 100 MHz. In FIG. 3, $Fe_{55}Hf_{11}O_{34}$ and $Co_{65}Hf_{12}O_{23}$ are comparative examples. In $Fe_{55}Hf_{11}O_{34}$, a small bcc (110) peak and a halo peak at 2θ=about 47° which shows an amorphous phase were observed. It was thus found that this sample comprises a bcc phase and an amorphous phase. The addition of Co to this sample gradually broadens the bcc (110) peak to produce a broad diffraction peak showing a hcp phase. In $Co_{65}Hf_{12}O_{23}$ in which Fe was completely substituted by Co, the diffraction peak of hcp phase comprises a fine diffraction peak and a halo peak. It is thus thought that this sample comprises a micro hcp phase and an amorphous phase. This sample showed a small $\mu'$ value, and thus sufficient soft magnetic characteristics cannot be obtained. These results indicate that the high frequency soft magnetic alloy of the present invention has a fine crystalline structure immediately after film formation, and that the ratio of the amorphous phase is 30% or more, and preferably 30 to 80% (% by area), of the whole texture.

Figure 4:
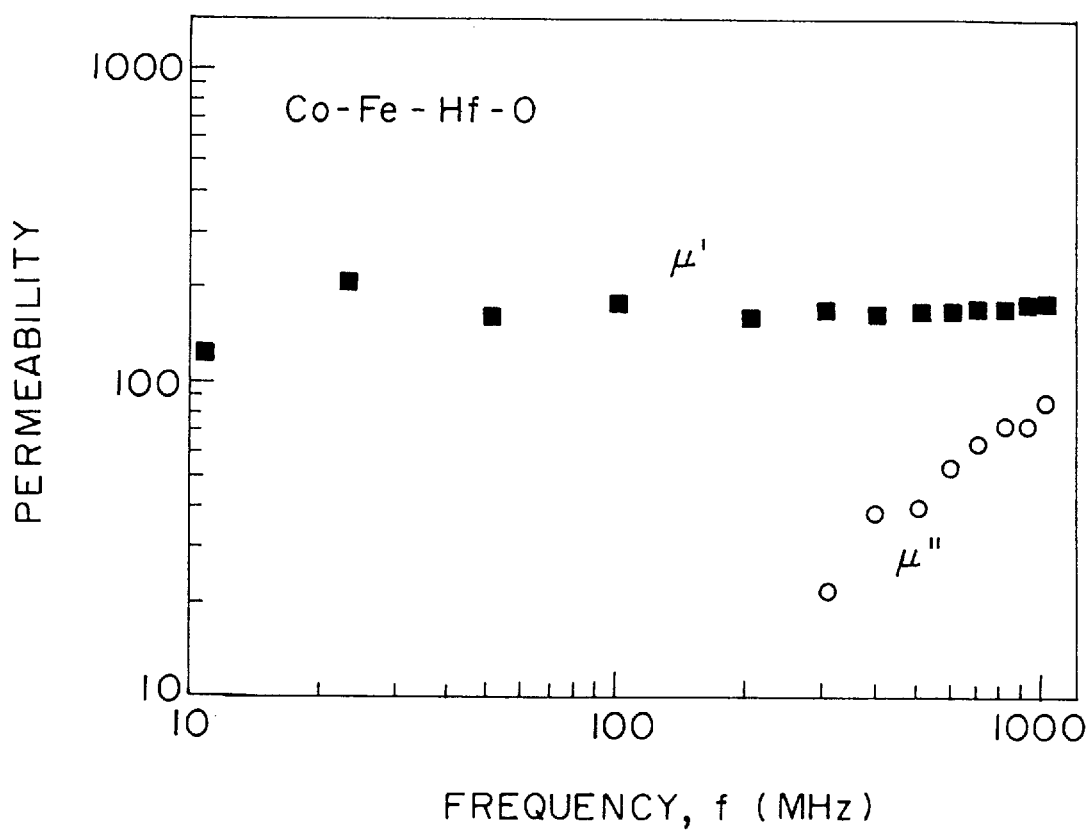
FIG. 4 is a graph showing the frequency dependency of magnetic permeability of an alloy film of an example of the present invention.

FIG. 4 shows the results of measurement of the frequency dependency of magnetic permeability of a sample having the composition, $Co_{46.5}Fe_{17.5}Hf_{14.4}O_{21.6}$. This sample exhibited Q=2 even at 1 GHz, and was thus found to produce a lower loss than a conventional material in the GHz band. It was thus found that this sample is suitable as a magnetic core of a transformer, a plane magnetic element (inductor) and an antenna. Since this sample shows a higher value of $\mu''$ in the GHz band than a FeMO type material, this sample is also suitable for a member of a wave absorber.

Figure 5:
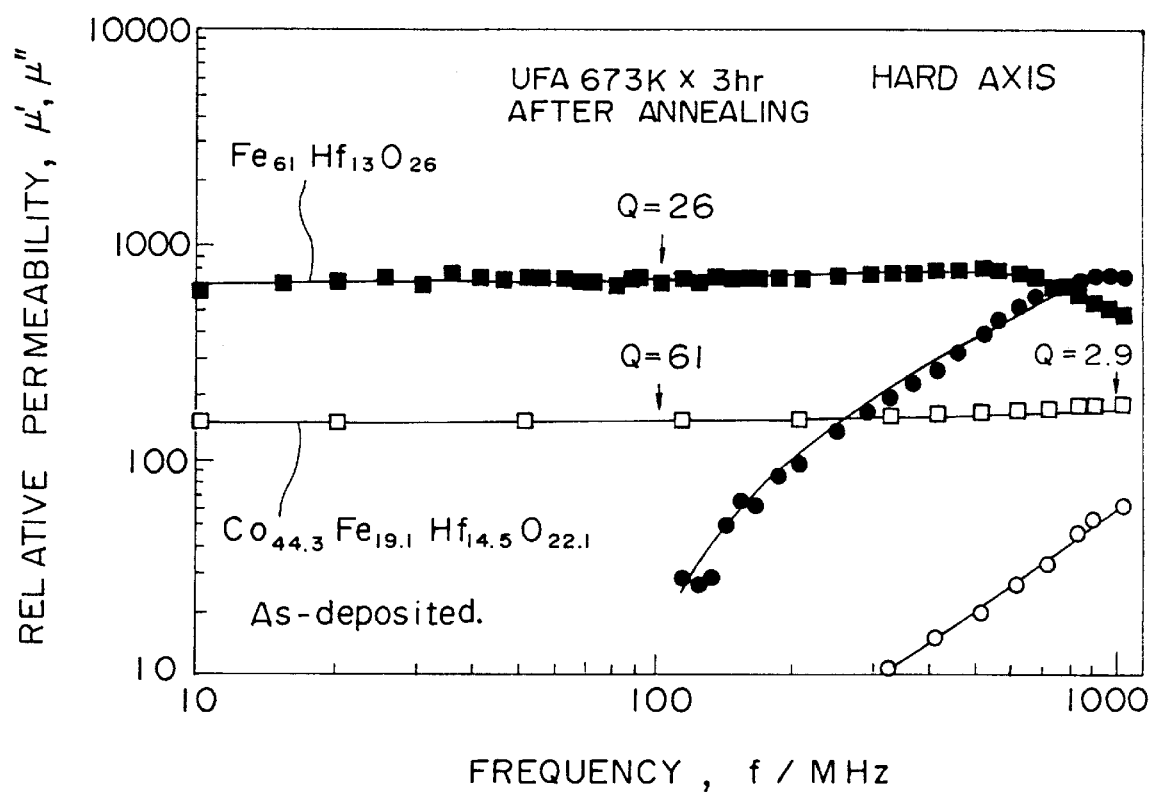
FIG. 5 is a graph showing the frequency dependency of permeability of alloy films of an example of the present invention and a comparative example.

FIG. 5 shows the frequency dependency of $\mu'$ and $\mu''$ of a sample having the composition, $Co_{44.3}Fe_{19.1}Hf_{14.5}O_{22.1}$. This sample was in the as-deposited state after film formation in a magnetostatic field, and the permeability was measured in the direction of the hard magnetization axis. FIG. 5 reveals that $\mu'$ is substantially constant up to 1 GHz, $\mu''$ is also maintained in a low level, and Q is 61 at 100 MHz and 2.9 even at 1 GHz. This sample exhibited saturation magnetization of 1.1 T and resistivity ($\rho$) of as high as 1400 $\mu\Omega$·cm. The natural resonance frequency was also as high as 1 GHz or more. The sample having the composition, $Fe_{61}Hf_{13}O_{26}$, shown as a comparative example in FIG. 5 was subjected to heat treatment at 400° C. for 3 hours in a magnetostatic field. This sample exhibited high values of both $\mu'$ and $\mu''$, and Q is as low as 26 at 100 MHz.

Figure 6:
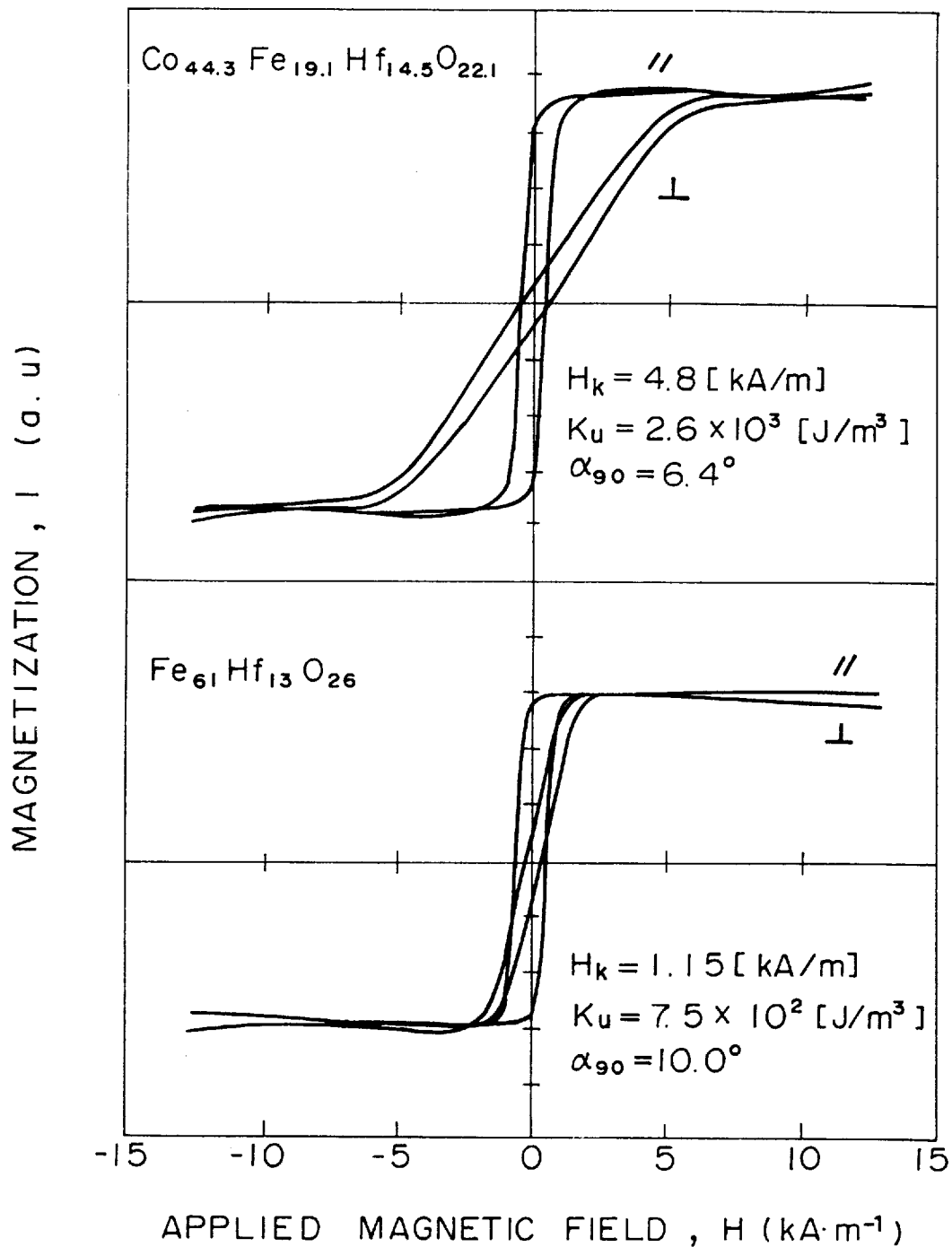
FIG. 6 is a graph showing magnetization curves of alloy films of an example of the present invention and a comparative example.

FIG. 6 shows comparison between magnetization curves of the sample having the composition, $Co_{44.3}Fe_{19.1}Hf_{14.5}O_{22.1}$, and the comparative example having the composition, $Fe_{61}Hf_{13}O_{26}$. In FIG. 6, curves shown by // are magnetization curves in the direction of the easy magnetization axis, and curves shown by ⊥ are magnetization curves in the direction of the hard magnetization axis. FIG. 6 indicates that the sample of $Co_{44.3}Fe_{19.1}Hf_{14.5}O_{22.1}$ shows an anisotropic magnetic field Hk of 4.8 kA/m which is about 4 times that of the sample of $Fe_{61}Hf_{13}O_{26}$, and large anisotropic energy ku. The sample of $Co_{44.3}Fe_{19.1}Hf_{14.5}O_{22.1}$ also shows a smaller value of angle dispersion ($\alpha_{90}$) of anisotropy which was measured by a B—H tracer, and it is thus found that substitution of Fe with Co imparts strong uniaxial anisotropy to the sample. Consequently, it is thought that the frequency characteristics are improved, as shown in FIGS. 4 and 5.

Various alloy films having compositions different from the above compositions in the composition system of the present invention were formed by the same method as described above, and the value of the real number ($\mu'$) and the value of the imaginary number ($\mu''$) of complex magnetic permeability of each alloy film sample at 500 MHz were measured. The crystal structure and average crystal grain size specified from the results of electron beam diffraction and X-ray diffraction are shown in Table 1 below.

TABLE 1

| Film Composition | $\mu'$ | $\mu''$ | Crystal structure | Average grain size |
|---|---|---|---|---|
| $(Co_{0.9}Fe_{0.1})_{67}Zr_{12}O_{20}$ | 250 | 120 | fcc + bcc | 4~6 nm |
| $(Co_{0.7}Fe_{0.3})_{60}Ti_{15}O_{25}$ | 110 | 40 | bcc | 3~5 nm |
| $(Co_{0.75}Fe_{0.25})_{62}Nb_{14}O_{24}$ | 70 | 40 | bcc | 5~7 nm |
| $(Co_{0.71}Fe_{0.29})_{66}Ta_{13}O_{21}$ | 60 | 40 | bcc | 5~7 nm |
| $(Co_{0.8}Fe_{0.2})_{60}Mo_{15}O_{25}$ | 70 | 30 | bcc | 5~8 nm |

TABLE 1-continued

| Film Composition | $\mu'$ | $\mu''$ | Crystal structure | Average grain size |
|---|---|---|---|---|
| $(Co_{0.73}Fe_{0.27})_{58}W_{16}O_{26}$ | 70 | 30 | bcc | 5~8 nm |
| $(Co_{0.68}Fe_{0.32})_{60}Hf_{15}O_{19}N_6$ | 90 | 20 | bcc | 4~6 nm |
| $(Co_{0.72}Fe_{0.28})_{59}Hf_{16}O_{20}C_5$ | 310 | 180 | bcc | 5~8 nm |
| $(Co_{0.72}Fe_{0.28})_{59}Hf_{15}O_{19}B_7$ | 100 | 30 | bcc | 4~6 nm |
| $(Co_{0.67}Fe_{0.33})_{57}Hf_{17}O_{26}$ | 70 | 30 | fcc | 3~5 nm |
| $(Co_{0.85}Fe_{0.15})_{59}Hf_{16}O_{25}$ | 100 | 30 | fcc | 3~5 nm |
| $(Co_{0.8}Fe_{0.2})_{57}Hf_{16}O_{27}$ | 60 | 10 | fcc | 3~5 nm |
| $(Co_{0.7}Fe_{0.3})_{58}Hf_{14}O_{25}Cr_3$ | 110 | 20 | bcc | 3~5 nm |
| $(Co_{0.7}Fe_{0.3})_{61}Hf_{14}O_{25}Cr_3$ | 130 | 20 | bcc | 3~5 nm |

The above-described characteristics reveal that the soft magnetic alloy in accordance with the present invention has high resistivity, as the soft magnetic alloy of the mixture type comprising a FeMO type microcrystalline phase and an amorphous phase, for which the inventors previously filed an application, and is thus characterized by a low eddy current loss. It is also apparent that, since the soft magnetic alloy of the present invention has uniaxial magnetic anisotropy which is several times as large as the FeMO type soft magnetic alloy, a natural resonance frequency is shifted to a higher frequency zone, and a natural resonance loss in the GHz band can thus be decreased.

Figure 7A:
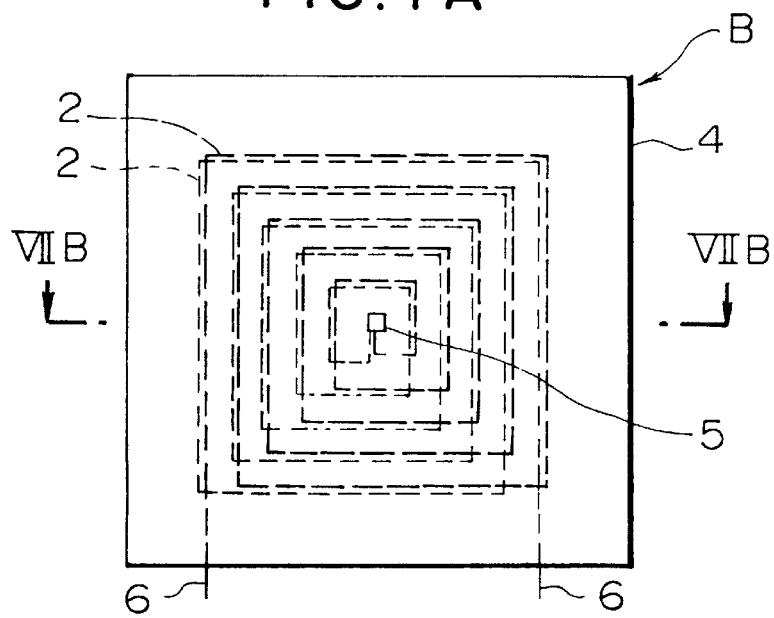
FIG. 7A is a plan view showing a first example of a plane magnetic element in accordance with the present invention.
Figure 7B:
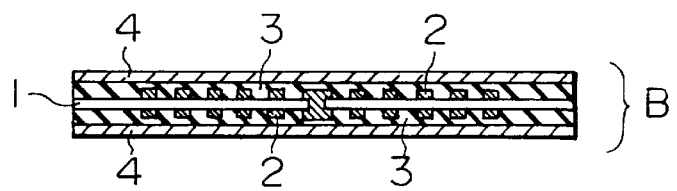
FIG. 7B is a sectional view taken along line VIIB—VIIB of FIG. 7A.

FIGS. 7(a) and (b) show a first example of the structure of a plane magnetic element (inductor) which was produced by using a magnetic film of the soft magnetic alloy having the above composition.

An inductor B of this example comprises spiral plane coils 2 formed on both sides of a substrate 1, insulating films 3 provided to cover the coils 2 and the substrate surfaces, and magnetic films 4 coated on the respective insulating films 3, the central portions of the coils 2 being electrically connected to each other through a through hole 5 formed in the central portion of the substrate 1. Terminals 6 are respectively led out from the coils 2 on both sides of the substrate 1.

In the inductor B having such a construction, the plane coils 2 are respectively held by the magnetic films 4 through the insulating films 3 to form an inductor between the terminals 6.

The substrate 1 comprises a ceramic substrate, a Si wafer substrate or a resin substrate. When the substrate comprises a ceramic material, any desired material can appropriately be selected from alumina, zirconia, silicon carbide, silicon nitride, aluminum nitride, steatite, mullite, cordierite, forsterite and spinel. However, in order to obtain a coefficient of thermal expansion close to that of Si, aluminum nitride or the like having high thermal conductivity and high bending strength is preferably used.

Each of the plane coils 2 comprises a metallic material having good conductivity, such as copper, silver, gold, aluminum, or an alloy thereof, and can be appropriately arranged electrically in series in the longitudinal or lateral direction in accordance with inductance, DC superposition characteristics, the size, etc. A plurality of plane coils 2 can be arranged in parallel to form a transformer. The plane coil 2 can also be formed in various forms by photoetching after a conductive layer is formed on the substrate. The conductive layer may be formed by an appropriate method such as press bonding, plating, metal spraying, vacuum deposition, sputtering, ion plating, screen printing burning or the like.

The insulating films 3 are provided for preventing short circuit due to conduction with the magnetic films 4 when electricity is supplied to the plane coils 2. Each of the insulating films 3 preferably comprises a polymer film such as polyimide or the like; or an inorganic film of $SiO_2$, glass, a hard carbon film or the like. The insulating films 3 are formed by a method of comprising printing paste and then burning, a hot dipping method, spraying, vapor plating, vacuum deposition, sputtering, ion plating, etc.

Each of the magnetic films 4 comprises a film of a soft magnetic alloy having the above-described composition.

Since the inductor B constructed as described above is small, thin and light weight, and comprises the magnetic films 4 having excellent magnetic characteristics, the inductor B contributes to reductions in the size and weight of the plane magnetic element and exhibits excellent inductance.

Figure 8:
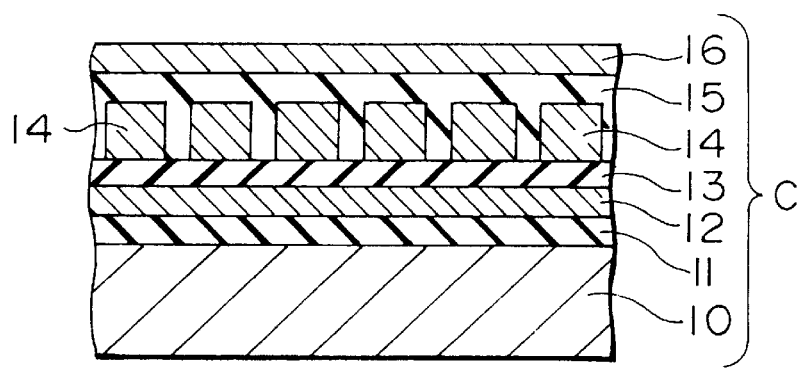
FIG. 8 is a sectional view showing a second example of a plane magnetic element in accordance with the present invention.

FIG. 8 shows a second example of the structure of an inductor comprising a magnetic film of the soft magnetic alloy having the above composition.

Inductor C of this example comprises an oxide film 11, a magnetic film 12 and an insulating film 13 which are laminated in turn on a substrate 10, a plane coil 14 formed on the insulating film 13, an insulating film 15 formed to cover the plane coil 14 and the insulating film 13, and a magnetic film 16 formed on the insulating film 15.

The substrate 10, the magnetic film 12 and the insulating film 13 comprise the same materials as the substrate 1, the magnetic films 4 and the insulating film 3, respectively, of the first example.

When a Si wafer substrate is used as the substrate 10, the oxide film 11 can be formed by thermal oxidation of the Si wafer under heating. The oxide film 11 is not essential and may be thus omitted.

Like the inductor B of the first example, the inductor C having the construction of this example exhibits excellent inductance, is small and light weight, and thus contributes to reductions in the size and weight of a plane magnetic element. Although the above examples are examples of a plane magnetic element (inductor), the present invention can also be applied to a transformer.

Figure 9:
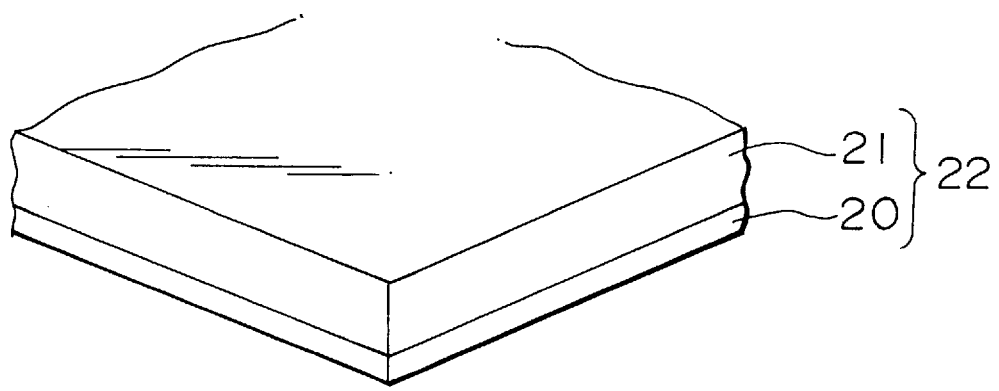
FIG. 9 is a perspective view showing a first example of an electromagnetic wave absorbing sheet in accordance with the present invention.

FIG. 9 shows an example of a wave absorber 22 comprising a magnetic film 20 of the soft magnetic alloy of the present invention, which is formed on a surface of a substrate sheet 21. In this example, the magnetic film 20 comprises the above-mentioned type alloy and is formed in a sheet.

Figure 10:
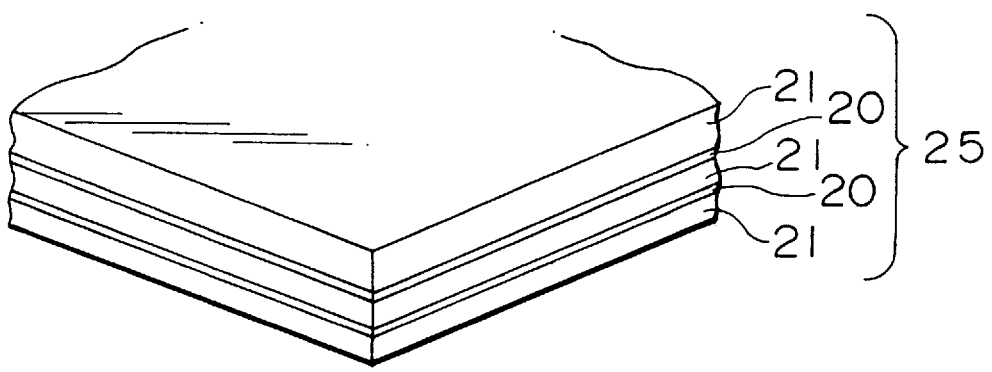
FIG. 10 is a perspective view showing a second example of an electromagnetic wave absorbing sheet in accordance with the present invention.
Figure 11:
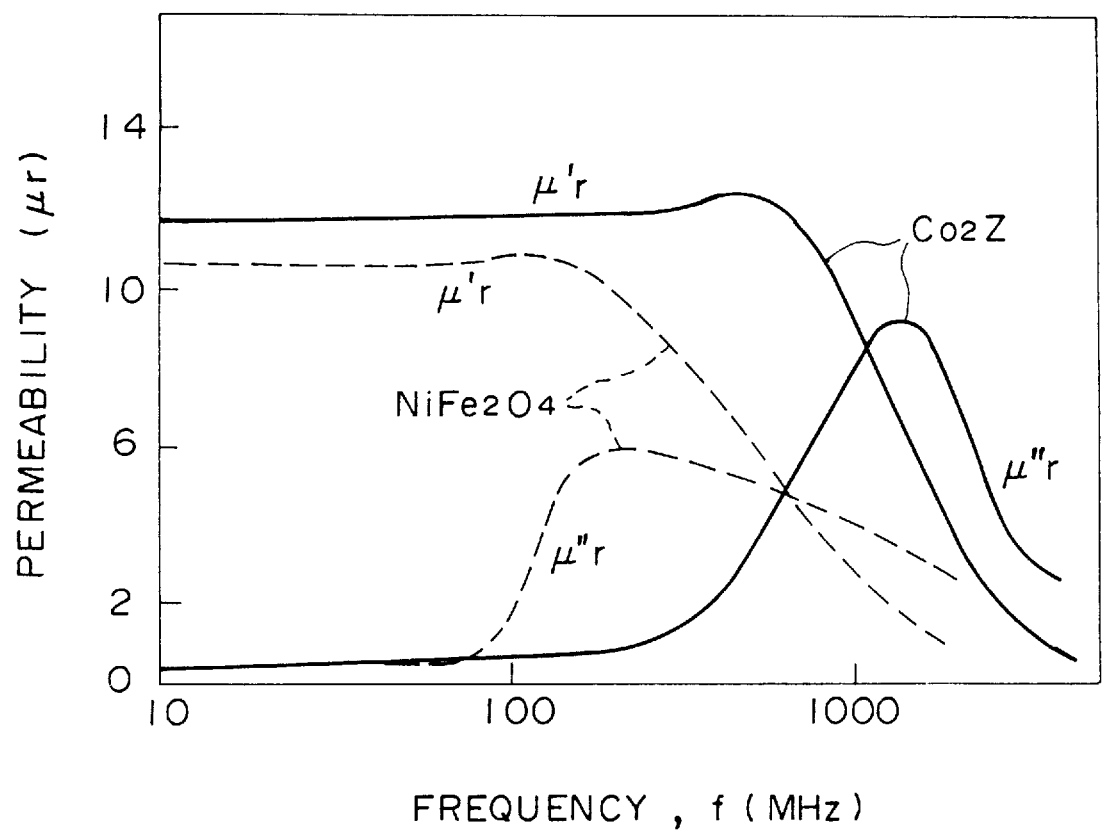
FIG. 11 is a graph showing the frequency dependency of permeability of conventional materials.

FIG. 10 shows a structure comprising a plurality of the wave absorbers shown in FIG. 9. The wave absorber 25 shown in FIG. 10 comprises three substrate sheets 21 which are laminated with the magnetic films 20 provided between the respective substrate sheets 21. Although each of the magnetic films 20 comprises the soft magnetic alloy having the above-described composition, it is preferable from the viewpoint of electromagnetic wave absorptivity the magnetic films 20 are preferably laminated so that the directions of uniaxial magnetic anisotropy cross each other at 90°.

As described above, the soft magnetic alloy of the present invention is a soft magnetic alloy having the above specified composition, containing Co as a main component at the specified composition ratio, exhibiting a high saturation magnetic flux density and excellent magnetic permeability, and permitting the realization of high resistivity. It is thus possible to provide a magnetic core having a low loss without increasing the Q value in the GHz band. Therefore, the soft magnetic alloy of the present invention greatly contributes to reductions in the size and weight and improvement in performance of a magnetic element such as a thin film transformer, a magnetic head core, a thin film inductor, a switching element or the like. In order to obtain more excellent magnetic characteristics, the alloy preferably has a crystal grain size of 7 nm or less, The soft magnetic alloy represented by the composition formula, $(Co_{1-c}T_c)_xM_yQ_zX_wY_s$, is capable of realizing high resistivity while maintaining a high saturation magnetic flux density, and controlling the real number and the imaginary number of permeability in a radio frequency band including the GHz band to a high value and an appropriate value, respectively. It is thus possible to provide a magnetic core with a low loss without decreasing the Q value in the radio frequency band.

Further, the composition within the range of the present invention can impart uniaxial magnetic anisotropy within an alloy plane, attain an anisotropic magnetic field of 10 Oe or more, and increase the resistivity to 200 $\mu\Omega\cdot cm$ or more, or 400 $\mu\Omega\cdot cm$ or more.

A plane magnetic element (inductor), a wave absorber and an antenna each comprising a magnetic core consisting of the soft magnetic alloy having the above composition can be used in the GHz band. The inductor and the antenna have excellent characteristics with respect to a low loss in the GHz band, and the wave absorber have good absorption characteristics in the GHz band.

What is claimed is:

1. A high frequency soft magnetic alloy comprising:
   a crystal phase containing Co and at least one element T selected from the group consisting of Fe, Ni, Pd, Mn and Al, wherein the crystal phase consists of crystal grains having a face-centered cubic structure, a body-centered cubic structure or a mixture thereof, and wherein each crystal grain has an average crystal grain size of 30 nm or less; and
   a ferromagnetic amorphous phase surrounding the crystal phase and containing:
   at least one element M selected from the group consisting of Ti, Zr, Hf, Nb, Ta, Mo, W, Y and rare earth elements,
   at least one element Q selected from O, N, C, B,
   at least one oxide of the element M,
   Fe, and
   the element T;
   wherein the amount of Co in the soft magnetic alloy is equal to or greater than the amount of Fe.

2. A high frequency soft magnetic alloy according to claim 1, wherein the average crystal grain size is 7 nm or less.

3. A high frequency soft magnetic alloy according to claim 1, wherein uniaxial anisotropy is present in a crystal face of each crystal grain, and the soft magnetic alloy includes an anisotropic magnetic field of 10 Oe or more.

4. A high frequency soft magnetic alloy according to claim 1, wherein the soft magnetic alloy has a resistivity of 200 $\mu\Omega\cdot cm$ or more.

5. A high frequency soft magnetic alloy according to claim 1, wherein the soft magnetic alloy has a resistivity of 400 $\mu\Omega\cdot cm$ or more.

6. A high frequency soft magnetic alloy according to claim 1, wherein the soft magnetic alloy has a magnetic resonance frequency of 2 GHz or more.

7. A high frequency soft magnetic alloy according to claim 1, wherein the ratio of the amorphous phase to the whole structure including both the amorphous phase and the crystal phase is 30% or more.

8. A high frequency soft magnetic alloy according to claim 1, having the following composition:

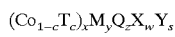

$(Co_{1-c}T_c)_xM_yQ_zX_wY_s$ wherein X is at least one of Si and Cr; and Y is at least one element selected from Au, Ag and platinum group elements;
wherein c is a composition ratio satisfying the relation $0.05 \leq c \leq 0.5$;
wherein y, z, w and s satisfy the relations $3 \leq y \leq 30$, $7 \leq z \leq 40$, $0 \leq w \leq 20$ and $0 \leq s \leq 20$, respectively by at %; and $x \geq 57$ at %.

9. A high frequency soft magnetic alloy according to claim 8, wherein the composition ratios y and z satisfy the relations $5 \leq y \leq 20$ and $10 \leq z \leq 30$, respectively, by at %.

10. A high frequency soft magnetic alloy according to claim 8, wherein the element T is Fe.

11. A plane magnetic element comprising a core consisting of a high frequency soft magnetic alloy comprising:
    a crystal phase containing Co and at least one element T selected from the group consisting of Fe, Ni, Pd, Mn and Al, wherein the crystal phase consists of crystal grains having a face-centered cubic structure, a body-centered cubic structure or a mixture thereof, and wherein each crystal grain has an average crystal grain size of 30 nm or less; and
    a ferromagnetic amorphous phase surrounding the crystal phase and containing:
    at least one element M selected from the group consisting of Ti, Zr, Hf, Nb, Ta, Mo, W, Y and rare earth elements,
    at least one element Q selected from O, N, C, B,
    at least one oxide of the element M,
    Fe, and
    the element T;
    wherein the amount of Co in the soft magnetic alloy is equal to or greater than the amount of Fe.

12. An antenna comprising an element consisting of a high frequency soft magnetic alloy comprising:
    a crystal phase containing Co and at least one element T selected from the group consisting of Fe, Ni, Pd, Mn and Al, wherein the crystal phase consists of crystal grains having a face-centered cubic structure, a body-centered cubic structure or a mixture thereof, and wherein each crystal grain has an average crystal grain size of 30 nm or less; and
    a ferromagnetic amorphous phase surrounding the crystal phase and containing:
    at least one element M selected from the group consisting of Ti, Zr, Hf, Nb, Ta, Mo, W, Y and rare earth elements,
    at least one element Q selected from O, N, C, B,
    at least one oxide of the element M,
    Fe, and
    the element T;
    wherein the amount of Co in the soft magnetic alloy is equal to or greater than the amount of Fe.

13. A wave absorber comprising an element consisting of a high frequency soft magnetic alloy comprising:
    a crystal phase containing Co and at least one element T selected from the group consisting of Fe, Ni, Pd, Mn and Al, wherein the crystal phase consists of crystal grains having a face-centered cubic structure, a body-centered cubic structure or a mixture thereof, and wherein each crystal grain has an average crystal grain size of 30 nm or less; and
    a ferromagnetic amorphous phase surrounding the crystal phase and containing:
    at least one element M selected from the group consisting of Ti, Zr, Hf, Nb, Ta, Mo, W, Y and rare earth elements,
    at least one element Q selected from O, N, C, B,
    at least one oxide of the element M,
    Fe, and
    the element T;
    wherein the amount of Co in the soft magnetic alloy is equal to or greater than the amount of Fe.

* * * * *